(12) United States Patent
Abugharbieh et al.

(10) Patent No.: US 8,638,125 B2
(45) Date of Patent: Jan. 28, 2014

(54) LOW VOLTAGE DIFFERENTIAL SIGNAL DRIVER WITH REDUCED POWER CONSUMPTION

(75) Inventors: Khaldoon Abugharbieh, San Jose, CA (US); Jitendra Mohan, Santa Clara, CA (US); Ivan Duzevik, Portland, ME (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 13/159,672

(22) Filed: Jun. 14, 2011

(65) Prior Publication Data

US 2011/0234318 A1    Sep. 29, 2011

Related U.S. Application Data

(63) Continuation of application No. 12/049,045, filed on Mar. 14, 2008, now abandoned.

(51) Int. Cl.
*H03K 5/22* (2006.01)

(52) U.S. Cl.
USPC .......................................................... 327/65

(58) Field of Classification Search
None
See application file for complete search history.

(56) References Cited

U.S. PATENT DOCUMENTS

| | | |
|---|---|---|
| 4,808,853 A | 2/1989 | Taylor |
| 5,684,419 A | 11/1997 | Murden et al. |
| 5,914,630 A | 6/1999 | Peterson |
| 6,472,908 B1 | 10/2002 | Smetana |
| 7,116,945 B2 | 10/2006 | Moloudi et al. |
| 7,282,994 B2 | 10/2007 | Gopinathan et al. |
| 7,301,366 B1 | 11/2007 | Devnath et al. |
| 7,433,397 B2 | 10/2008 | Garlepp et al. |
| 7,449,949 B2 | 11/2008 | Sohn et al. |
| 7,573,332 B1 | 8/2009 | Kase |

OTHER PUBLICATIONS

Bratov, V. et al.; "Architecture and Implementation of a Low-Power LVDS Output Buffer for High-Speed Applications," IEEE Transactions on Circuits and Systems-I: Regular Papers, vol. 53, No. 10, Oct. 2006, pp. 2101-2108.

Chen, Mingdeng et al.; "Low-Voltage Low-Power LVDS Drivers," IEEE Journal of Solid-State Circuits, vol. 40, No. 2, Feb. 2005, pp. 472-479.

Kim, Sua et al.; "A 6-Gbps/pin 4.2m W/pin Half-Deuplex Pseudo-LVDS Transceiver," Solid-State Circuits Conference, 2006. ESSCIRC 2006. Proceedings of the 32nd European, Sep. 2006, pp. 484-487.

Chow, Hwang-Cherng et al.; "Low Power LVDS Circuit for Serial Data Communications," Proceedings of 2005 International Symposium on Intelligent Signal Processing and Communication Systems, Dec. 13-16, 2005, Hong Kong, pp. 293-296.

Tang, Qin et al.; "Low Power LVDS Driver Used in ADC Systems," Solid State and Integrated Circuit Technology, 2006, ICSICT '06. 8th International Conference on 2006, pp. 1664-1666.

*Primary Examiner* — Lincoln Donovan
*Assistant Examiner* — Sibin Chen
(74) *Attorney, Agent, or Firm* — Wade J. Brady, III; Frederick J. Telecky, Jr.

(57) ABSTRACT

A low voltage differential signal (LVDS) driver circuit with reduced power consumption. A pre-driver stage, implemented as a differential current mode amplifier, is driven by the differential input signal and provides a corresponding differential drive signal, which drives the output stage, implemented as a differential voltage mode amplifier, which, in turn, provides the differential output signal for the load. Total current consumption equals the load current, which is provided by the output stage, plus a much smaller current used by the pre-driver stage.

13 Claims, 7 Drawing Sheets

LOW VOLTAGE DIFFERENTIAL SIGNAL DRIVER WITH REDUCED POWER CONSUMPTION

RELATED APPLICATIONS

This is a continuation of U.S. patent application Ser. No. 12/049,045, filed Mar. 14, 2008 now abandoned, entitled "Low Voltage Differential Signal Driver with Reduced Power Consumption".

BACKGROUND

1. Field of the Invention

The present invention relates to differential signal drivers, and in particular, to low voltage differential signal (LVDS) driver circuits.

2. Related Art

Many integrated circuits ("chips") drive signals to and receive signals from other chips across a variety of signal media and media lengths. Typically, the signal media, e.g., cables, are designed to have a transmission line impedance of 50 ohms, which is typically matched to the output impedance of the transmitter and input impedance of the receiver. One example of the circuit used to drive such signals is an LVDS circuit, which is primarily used in short range applications, e.g., inter-chip signals on printed circuit boards. As is well known, advantages of LVDS circuits include high bandwidth, low power, reduced EMI (electromagnetic interference) effects, and better immunity to common mode noise.

Referring to FIG. 1, a typical LVDS circuit 10 includes a pre-driver stage 12 and output stage 14 for driving current through the load impedance 16 (typically a resistance of 100 ohms), the voltage across which is sensed by a receiver circuit 18 in accordance with well known principles. The data to be transferred arrives in the form of a differential signal 11c having opposing positive 11p and negative 11n signal phases. In response to this signal 11c, the pre-driver stage 12 produces a corresponding differential drive signal 13, also having opposing signal phases 13p, 13n, which the output stage 14 uses to produce the LVDS output signal 15 with its own opposing signal phases 15p, 15n. This signal 15 produces the load current 15i for conduction by the load impedance 16.

The power supply VDD provides a supply current 11a for the pre-driver stage 12 and a supply current 11b for the output stage 14. The output stage supply current 11b includes supply current Id for the output stage 14, as well as the current Iload needed for driving the load impedance 16. The amount of supply current consumed by the pre-driver stage 12 and output stage 14 can be, and often is, significant relative to the load current Iload.

Referring to FIGS. 2A and 2B, two forms of output stages 14 are typically used: voltage mode (FIG. 2A), and current mode (FIG. 2B). As is well known, the voltage mode driver 14a has the advantage of low power, but often provides poor line impedance matching. In contrast, the current mode diver 14b has the advantage of good line impedance matching, but generally consumes higher power.

Referring to FIG. 3, one example of a conventional current mode output stage 14a includes NPN bipolar junction transistors Q1, Q2, resistances R1, R2, and a current source 20a, interconnected substantially as shown. Each of the resistances R1, R2 is substantially equal to 50 ohms so as to be half of the 100 ohm impedance of the load 16. In such a circuit 14a, current I1 is equal to the load current 15i (I1=Iload), while current I2 is equal to three times the load current 15i (I2=3*Iload). As a result, the current source 20a must provide four times the amount of the load current so as to provide sufficient current for operation of the output stage 14a and sufficient current 15i for the load 16. Additionally, the signals 13p, 13n provided by the pre-driver stage 12 (not shown) must have sufficient drive current capacity to drive the large base-emitter capacitances of the transistors Q1, Q2.

Referring to FIG. 4, another example of a conventional current mode output stage 14b includes PMOS transistors P1, P2, NMOS transistors N1, N2, and current source circuits 20bp, 20bn, and a resistance R, all interconnected substantially as shown. In this circuit 14b, the resistance R is substantially equal to the load impedance of 100 ohms. Each of the two branch currents I1, I2 is equal (mutually exclusively in time) to two times the load current 15i (I1=I2=2*Iload). While this current is less than the current for the circuit of FIG. 3, additional current Ipd will still be required for the pre-driver stage 12 (not shown).

Referring to FIG. 5, another example of a conventional voltage mode output stage 14c is biased between two voltage potentials, Vhigh, Vlow rather than current sources, and does not require the internal resistance R. Accordingly, the two supply currents I1, I2 are needed during mutually exclusive time intervals and each one is equal to the load current 15i (I1=I2=Iload). However, the output impedance of this output stage 14c is dependent upon the channel characteristics of the individual transistors P1, P2, N1, N2, and, therefore, cannot be matched well to the 50 ohm impedance of the signal transmission medium and load 16. Accordingly, some form of calibration must be provided, e.g., in control of the device characteristics during manufacture or additional calibration circuitry.

Referring to FIG. 6, another example of a conventional voltage mode output stage 14d includes the transistors P1, P2, N1, N2 of the circuit of FIG. 5, plus resistances R1a, R2a, R1b, R2b, all interconnected substantially as shown. Each of the resistances R1a, R2a, R1b, R2b is 50 ohms so as to be half of the 100 ohm load impedance 16. Similar to the circuit 14c of FIG. 5, each of the mutually exclusive currents I1, I2 is equal to the load current 15i (I1=I2=Iload). Improved matching between the output stage impedance and the signal transmission medium is provided by the resistances R1a, R2a, R1b, R2b. However, this then requires the channel impedances of the transistors P1, P2, N1, N2, when in their turned-on states, to be as close to zero ohms as possible. As a result, the signals 13p, 13n provided by the pre-driver stage 12 (not shown) must be capable of driving the larger input capacitances at the gate electrodes of the transistors P1, P2, N1, N2.

Accordingly, it would be desirable to have a differential signal driver circuit topology that minimizes the amount of supply current needed, while also avoiding large input capacitances, as well as proper matching between the impedances of the output driver circuit and signal transmission medium.

SUMMARY

In accordance with the presently claimed invention, a low voltage differential signal (LVDS) driver circuit with reduced power consumption is provided. A pre-driver stage, implemented as a differential current mode amplifier, is driven by the differential input signal and provides a corresponding differential drive signal, which drives the output stage, implemented as a differential voltage mode amplifier, which, in turn, provides the differential output signal for the load. Total current consumption equals the load current, which is provided by the output stage, plus a much smaller current used by the pre-driver stage.

In accordance with one embodiment of the presently claimed invention, a differential signal driver includes:

first and second input electrodes to convey a differential input signal;

differential current mode amplifier circuitry coupled to the first and second input electrodes and responsive to the differential input signal by providing a corresponding differential drive signal;

current source circuitry to provide a load current;

first and second output electrodes for coupling to a predetermined load impedance; and differential voltage mode amplifier circuitry coupled to the current source circuitry, the differential current mode amplifier circuitry, and the first and second output electrodes, and responsive to the differential drive signal by conducting the load current via the load impedance when the load impedance is coupled to the first and second output electrodes.

In accordance with another embodiment of the presently claimed invention, a differential signal driver includes:

differential current mode amplifier means for receiving a differential input signal and in response thereto providing a corresponding differential drive signal;

current source means for providing a load current; and differential voltage mode amplifier means for receiving the differential drive signal and load current, and in response thereto conducting the load current via a predetermined load impedance when the load impedance is coupled to the differential voltage mode amplifier means.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
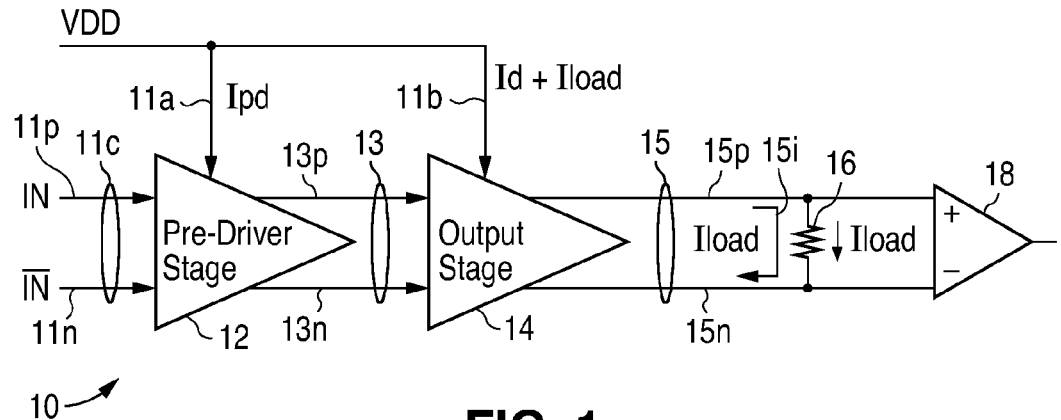
FIG. 1 is a block diagram of a conventional differential signal driver circuit.
Figure 2A:
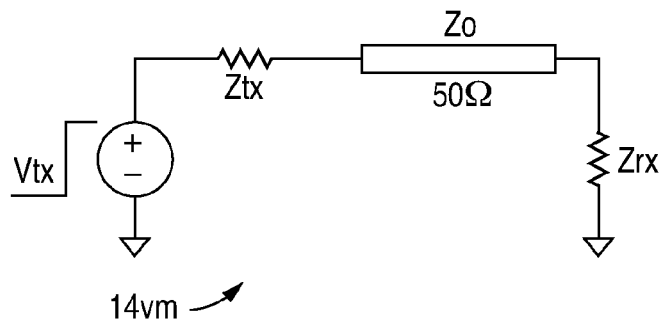
FIGS. 2A and 2B are schematics of conventional models for voltage mode and current mode signal drivers, respectively.
Figure 2B:
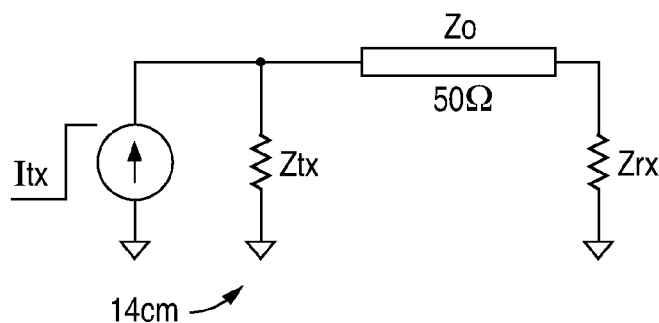
Figure 3:
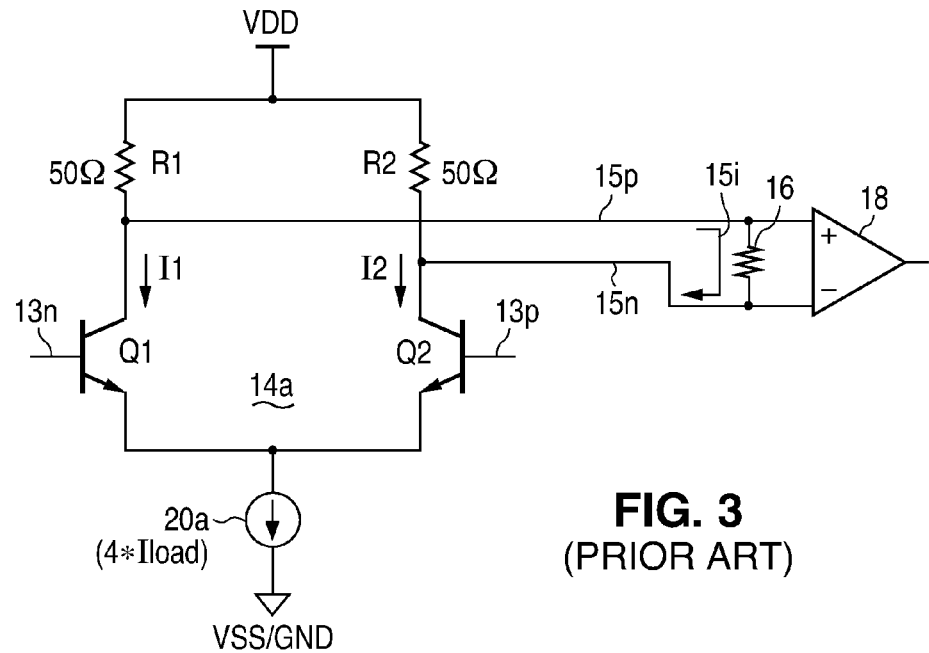
FIG. 3 is a schematic of a conventional current mode differential signal driver.
Figure 4:
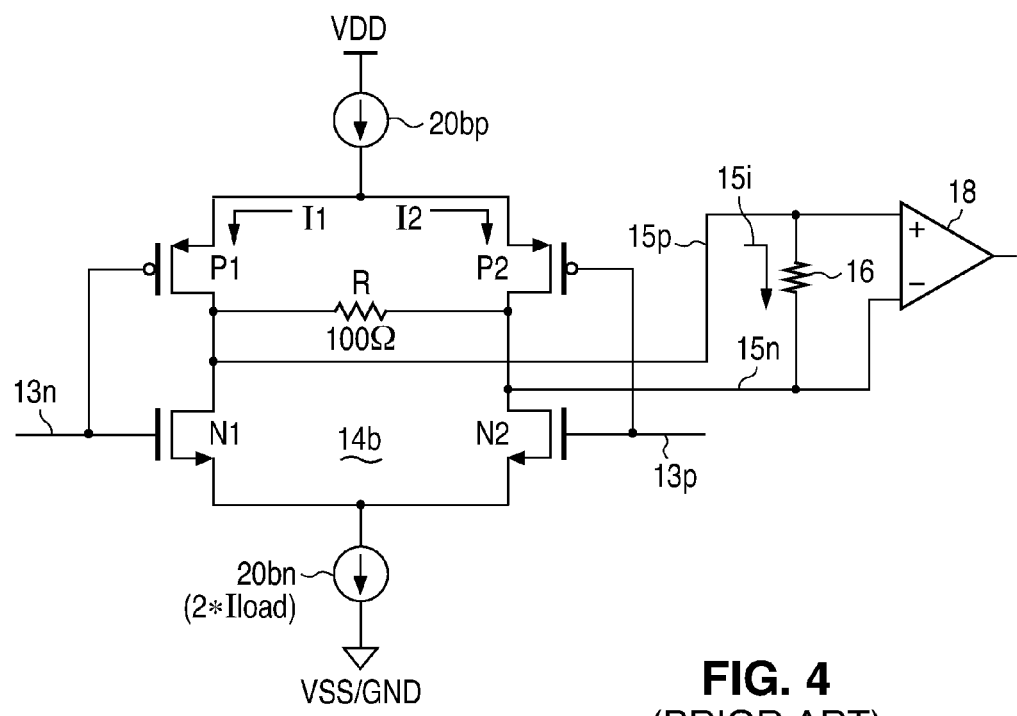
FIG. 4 is a schematic of another conventional current mode differential signal driver.
Figure 5:
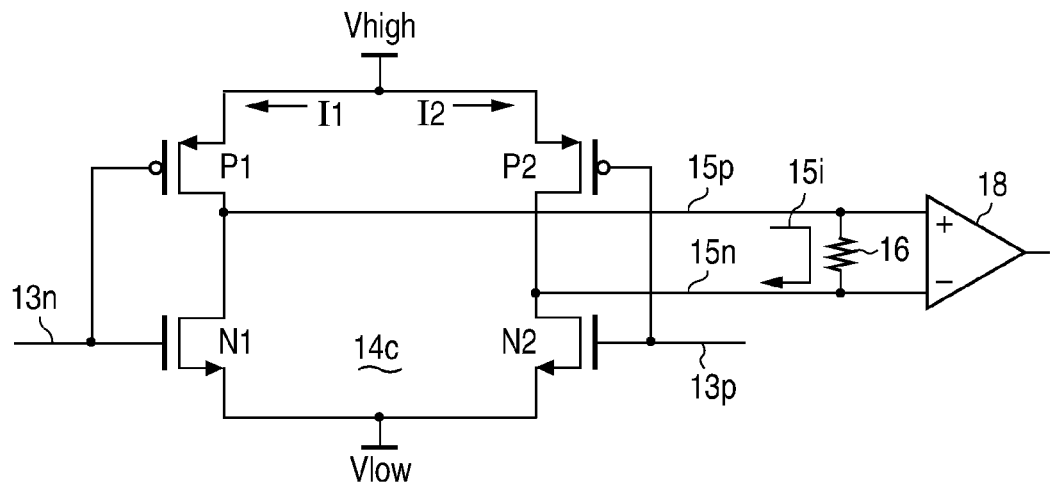
FIG. 5 is a schematic of a conventional voltage mode differential signal driver.
Figure 6:
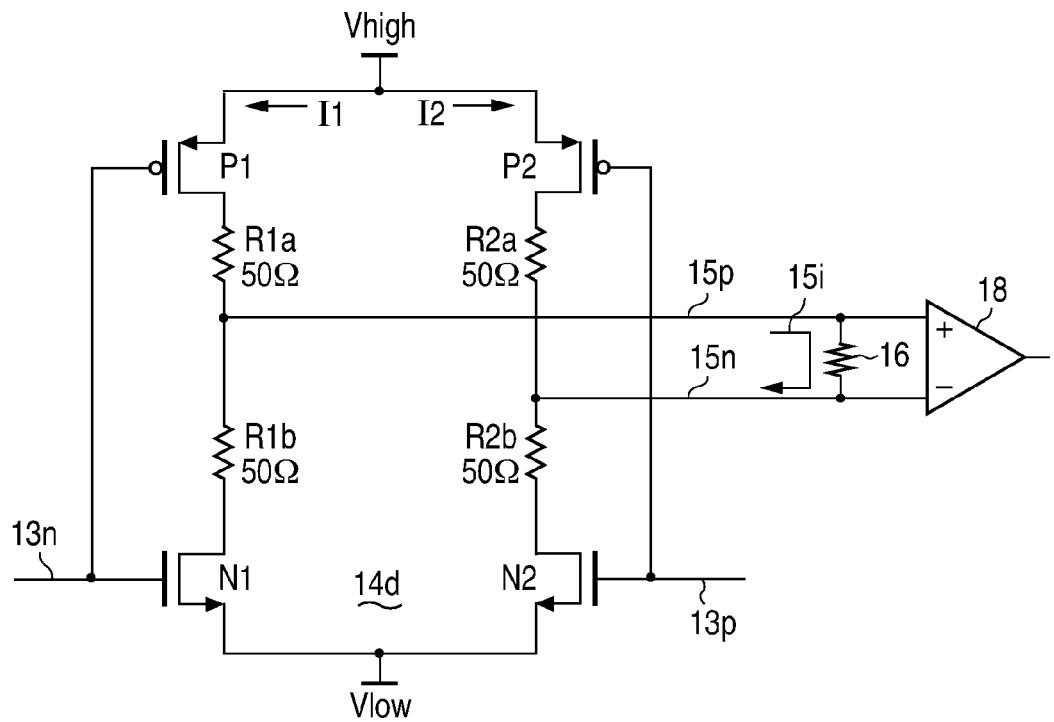
FIG. 6 is a schematic of another conventional voltage mode differential signal driver.
Figure 7:
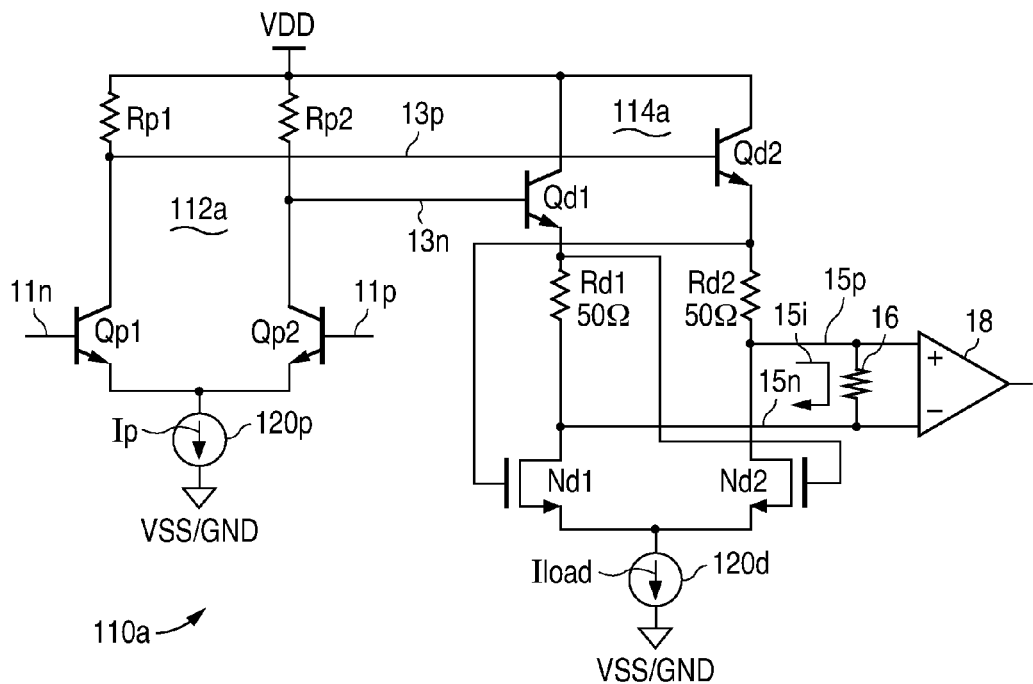
FIG. 7 is a schematic of a differential signal driver in accordance with one embodiment of the presently claimed invention.

Referring to FIG. 7, a differential signal driver 110a in accordance with one embodiment of the presently claimed invention includes a pre-driver stage 112a and an output stage 114a. The pre-driver stage 112a includes NPN transistors Qp1, Qp2, resistances Rp1, Rp2, and a current source 120p, interconnected substantially as shown. The signal phases 11p, 11n of the outgoing data signal drive the base electrodes of the transistors Qp1, Qp2, which then provide the pre-driver signal phases 13p, 13n via their collector electrodes.

The output stage 114a includes NPN transistors Qd1, Qd2, NMOS transistors Nd1, Nd2, resistances Rd1, Rd2, and a current source 120d, all interconnected substantially as shown. The pre-driver signals 13p, 13n drive the base electrodes of the NPN transistors Qd1, Qd2, the emitter electrodes of which drive the gate electrodes of the NMOS transistors Nd1, Nd2 and resistances Rd1, Rd2. The drain electrodes of the NMOS transistors Nd1, Nd2, with load current provided via the resistances Rd1, Rd2, provide the output signal phases 15p, 15n.

The current required by the output stage 114a, as supplied by the current source 120d, is equal to the required load current Iload. As for matching the output impedance of the output stage 114a to the load 16 (as well as the signal transmission medium), it should be readily understood that the 100 ohms of the load impedance 16 is matched by the sum of the impedances of the resistances Rd1, Rd2. As should be readily understood by one of ordinary skill in the art, an AC signal analysis will show that the upper ends of the resistances Rd1, Rd2, are effectively terminated at signal ground potential due to the extremely low impedances of the emitter follower outputs at the emitters of the NPN transistors Qd1, Qd2, while at the lower ends of the resistances Rd1, Rd2, the NMOS transistors Nd1, Nd2 do not affect the signal due to the high impedances of their channels while operating in saturation. Additionally, the supply current Ip required by the pre-driver stage 112a can be minimized by increasing the resistance values of the pre-driver resistances Rp1, Rp2, since the pre-driver output signals 13p, 13n drive the large input impedances of the output stage emitter followers (transistors Qd1, Qd2). Accordingly, this will reduce the pre-driver stage current Ip, thereby reducing power consumption.

Figure 8:
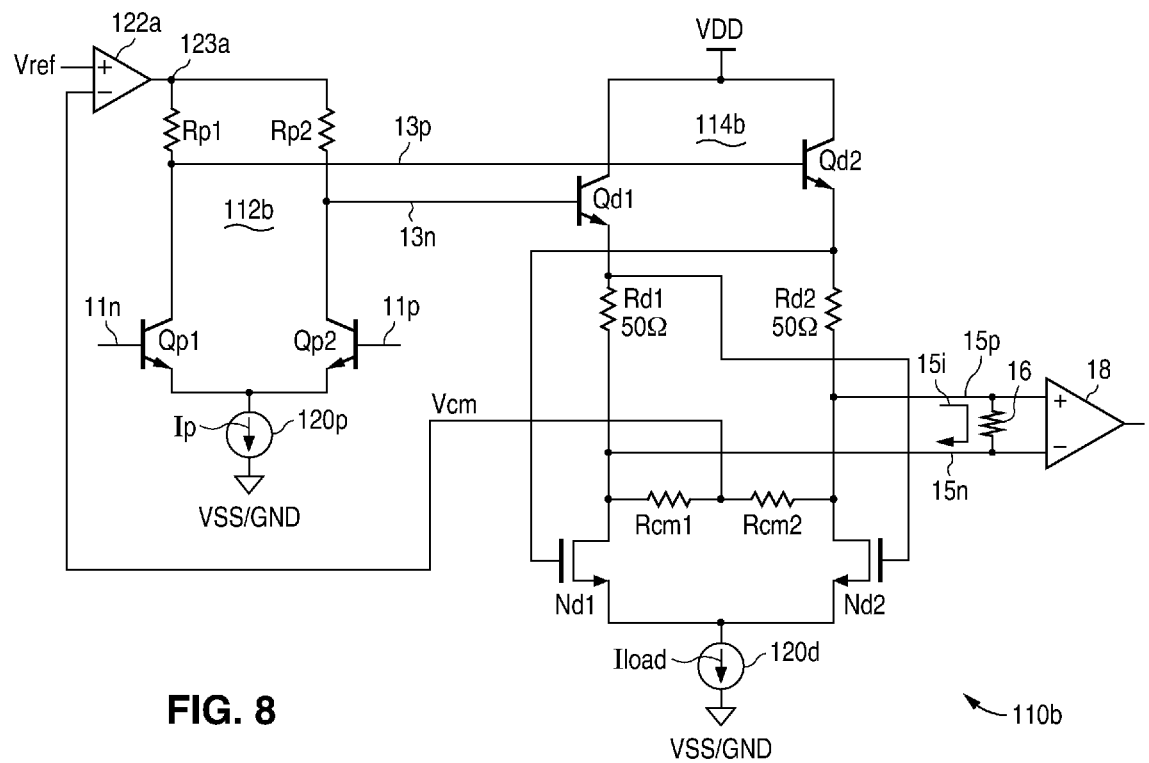
FIG. 8 is a schematic of a differential signal driver in accordance with another embodiment of the presently claimed invention.

Referring to FIG. 8, in accordance with an alternative embodiment 110b of the presently claimed invention, the output common mode voltage can be sensed by including two serially connected resistances Rcm1, Rcm2 between the output electrodes. The common mode voltage Vcm appearing between these resistances Rcm1, Rcm2 is fed back to a voltage comparator 122a for comparison with a reference voltage Vref to provide a controlled supply voltage 123a for the pre-driver stage 112a.

Figure 9:
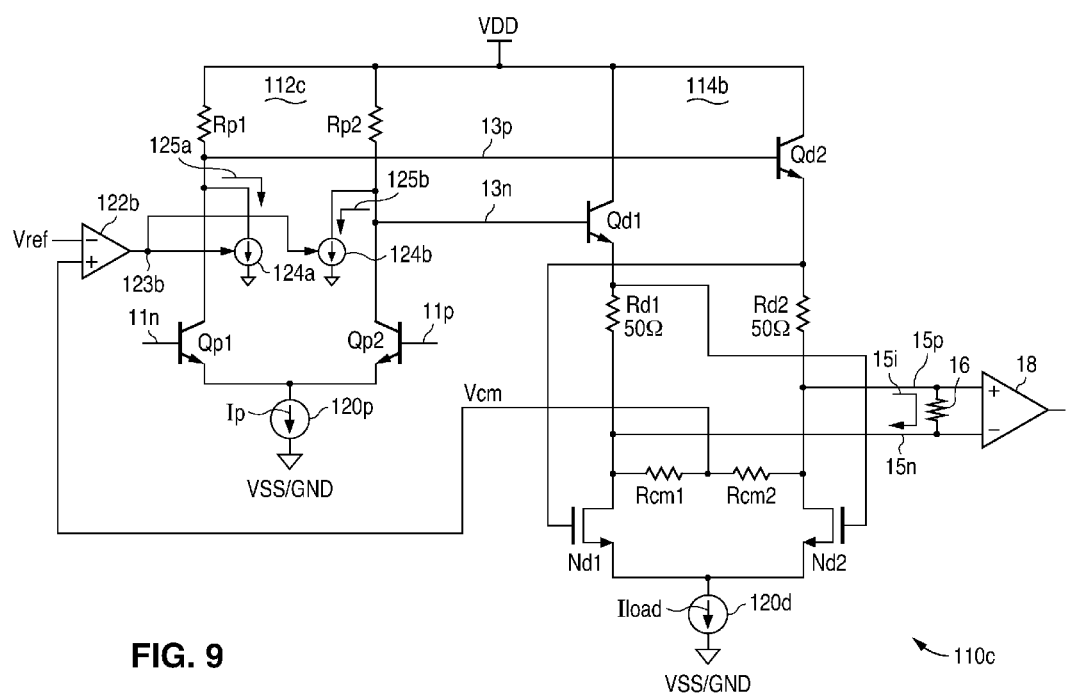
FIG. 9 is a schematic of a differential signal driver in accordance with another embodiment of the presently claimed invention.

Referring to FIG. 9, in another alternative embodiment 110c of the presently claimed invention, the common mode voltage Vcm can be controlled by feeding it back for comparison with the reference voltage Vref in a voltage comparator 122b used to control shunt current sources 124a, 124b. The voltage comparator 122b, in accordance with the relative values of the reference voltage Vref and common mode voltage Vcm, provides a control voltage 123b for the shunt current sources 124a, 124b, which shunt respective currents 125a, 125b from the circuit branches of the pre-drive circuit 112c, thereby controlling the common mode voltage of the pre-driver output signals 13p, 13n. For example, if the output common mode voltage Vcm were to increase, the control voltage 123b would cause the shunt currents 125a, 125b to increase, thereby causing the common mode voltage of the pre-driver output signals 13p, 13n to decrease and, in turn, cause the output common mode voltage Vcm to decrease as well.

Figure 10:
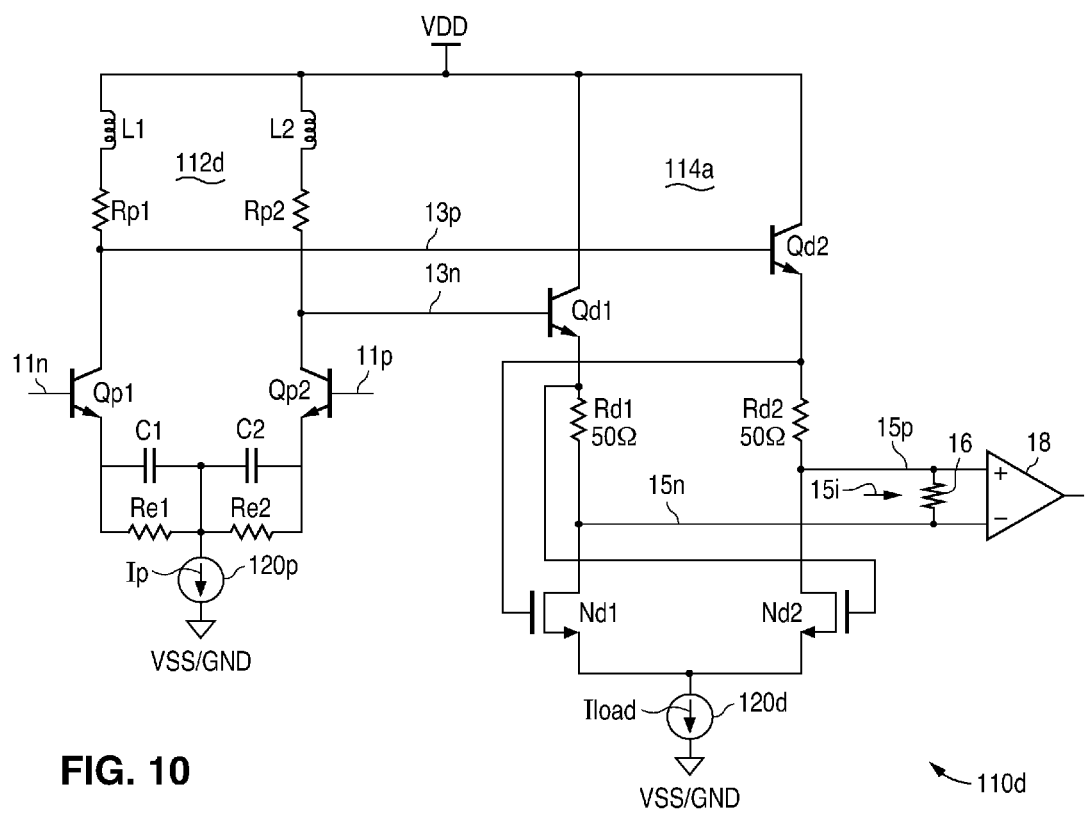
FIG. 10 is a schematic of a differential signal driver in accordance with another embodiment of the presently claimed invention.

Referring to FIG. 10, in accordance with another alternative embodiment 110d of the presently claimed invention, signal pre-emphasis can be provided with the addition of emitter resistances Re1, Re2, emitter capacitances C1, C2, and inductances L1, L2, all interconnected substantially as shown. As should be readily understood, signal gain will increase with frequency in accordance with the relative values of the collector resistances Rp1, Rp2, emitter resistances Re1, Re2, emitter capacitances C1, C2, and inductance values L1, L2. Alternatively, the inductances L1, L2 can be omitted in which case, the relative values of the resistances Rp1, Rp2, Re1, Re2 and capacitances C1, C2 will determine the signal gain with frequency, in accordance with well known principles.

Figure 11:
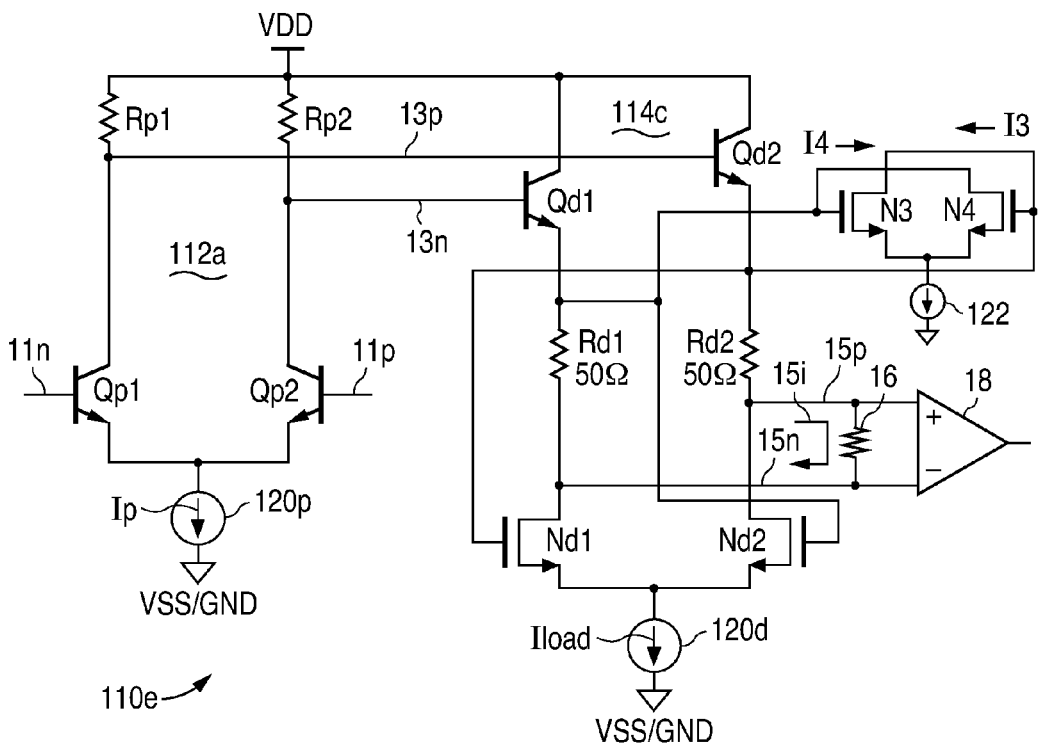
FIG. 11 is a schematic of a differential signal driver in accordance with another embodiment of the presently claimed invention.

Referring to FIG. 11, in accordance with another alternative embodiment 110e of the presently claimed invention, the output stage 114c can include a "keep alive" current circuit with NMOS transistors N3, N4 and a tail current source 122, connected substantially as shown. Such additional circuitry can be useful for increasing the switching speed of the output stage 114c by maintaining the flow of a small current I3 or I4 depending upon which devices are currently conducting signal current. Accordingly, those devices not currently conducting signal current will nonetheless maintain a small amount of current flow so as to be turned on more fully and more quickly when it is their turn to conduct signal current.

As should be readily understood by someone of ordinary skill in the art, the circuit topologies discussed herein for the example embodiments of the presently claimed invention can also be implemented by switching the bipolar and MOS transistors. For example, the bipolar transistors Qp1, Qp2, Qd1, Qd2 can be replaced with MOS field effect transistors, while NMOS transistors Nd1, Nd2 are replaced with bipolar transistors. Additionally, depending upon a desired speed of operation or signal gain, degeneration resistances can be included or not included in the tail transistors Nd1, Nd2.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a differential signal driver, comprising:
    first and second input electrodes to convey a differential input signal;
    differential current mode amplifier circuitry coupled to said first and second input electrodes and responsive to said differential input signal by providing a corresponding differential drive signal;
    current source circuitry to provide a load current;
    first and second output electrodes for coupling to a predetermined load impedance; and
    differential voltage mode amplifier circuitry coupled to said current source circuitry, said differential current mode amplifier circuitry, and said first and second output electrodes, and responsive to said differential drive signal by conducting said load current via said load impedance when said load impedance is coupled to said first and second output electrodes, wherein said differential voltage mode amplifier circuitry includes
        a first circuit branch including a first resistance and first and second transistors coupled in series to said current source circuitry and to said first output electrode; and
        a second circuit branch including a second resistance and third and fourth transistors coupled in series to said current source circuitry and to said second output electrode; wherein, when said load impedance is coupled to said first and second output electrodes, said load current is conducted via said load impedance by said first resistance and first and fourth transistors in alternation with said second resistance and second and third transistors, and said alternating conductances of said load current by said second and fourth transistors are controlled by said third and first transistors, respectively.

2. The apparatus of claim 1, wherein said differential current mode amplifier circuitry comprises:
    a current source circuit;
    a first circuit branch including a third resistance and a fifth transistor coupled in series to said current source circuit; and
    a second circuit branch including a fourth resistance and a sixth transistor coupled in series to said current source circuit;
    wherein said fifth and sixth transistors include first and second control electrodes, respectively, coupled to said first and second input electrodes, respectively.

3. The apparatus of claim 2, wherein said fifth and sixth transistors comprise first and second bipolar junction transistors.

4. The apparatus of claim 1, wherein:
    said first and second transistors comprise a first bipolar junction transistor and a first field effect transistor, respectively; and
    said third and fourth transistors comprise a second bipolar junction transistor and a second field effect transistor, respectively.

5. The apparatus of claim 1, further comprising:
    voltage sensing circuitry coupled between said first and second output electrodes to provide a feedback signal indicative of a common mode voltage associated with said conducting of said load current via said load impedance; and voltage source circuitry coupled to said voltage sensing circuitry and said differential current mode amplifier circuitry, and responsive to said feedback signal and a reference signal by providing a first supply voltage, wherein said differential current mode amplifier circuitry is further responsive to said first supply voltage, along with said differential input signal, by providing said differential drive signal.

6. The apparatus of claim 5, wherein said differential voltage mode amplifier circuitry is further responsive to a second supply voltage substantially unrelated to said first supply voltage, along with said differential drive signal, by conducting said load current via said load impedance when said load impedance is coupled to said first and second output electrodes.

7. The apparatus of claim 1, further comprising:
voltage sensing circuitry coupled between said first and second output electrodes to provide a feedback signal indicative of a common mode voltage associated with said conducting of said load current via said load impedance; and
additional current source circuitry coupled to said voltage sensing circuitry and said differential current mode amplifier circuitry, and responsive to said feedback signal and a reference signal by providing first and second bias currents, wherein said differential current mode amplifier circuitry is further responsive to said first and second bias currents, along with said differential input signal, by providing said differential drive signal.

8. The apparatus of claim 7, wherein said additional current source circuitry comprises:
voltage comparison circuitry responsive to said feedback signal and reference signal by providing a current control signal; and
shunt current source circuitry coupled to said voltage comparison circuitry and responsive to said current control signal by providing said first and second bias currents.

9. The apparatus of claim 1, wherein said differential current mode amplifier circuitry comprises:
a current source circuit;
pre-emphasis circuitry coupled to said current source circuit;
a first circuit branch including a first resistance and a first transistor coupled in series to said pre-emphasis circuitry; and
a second circuit branch including a second resistance and a second transistor coupled in series to said pre-emphasis circuitry; and wherein said first and second transistors include first and second control electrodes coupled to said first and second input electrodes.

10. The apparatus of claim 9, wherein said pre-emphasis circuitry comprises:
a third resistance and a first capacitance coupled between said current source circuit and first circuit branch; and
a fourth resistance and a second capacitance coupled between said current source circuit and second circuit branch.

11. The apparatus of claim 9, wherein:
said first circuit branch further includes a first inductance coupled in series with said first resistance and first transistor; and
said second circuit branch further includes a second inductance coupled in series with said second resistance and second transistor.

12. The apparatus of claim 1, wherein said differential voltage mode amplifier circuitry includes first and second internal electrodes and is responsive to said differential drive signal by providing a differential internal signal related to said differential drive signal, and further comprising additional current source circuitry coupled to said first and second internal electrodes and responsive to said differential internal signal by providing one or more bias currents substantially unrelated to said load current, wherein said differential voltage mode amplifier circuitry is further responsive to said one or more bias currents, along with said differential drive signal, by conducting said load current via said load impedance when said load impedance is coupled to said first and second output electrodes.

13. The apparatus of claim 12, wherein said one or more bias currents comprises a plurality of bias currents and said additional current source circuitry comprises:
a first transistor coupled to said first and second internal electrodes and responsive to said differential internal signal by conducting one of said plurality of bias currents;
a second transistor coupled to said first and second internal electrodes and responsive to said differential internal signal by conducting another of said plurality of bias currents; and
a current source circuit coupled to said first and second transistors to provide said plurality of bias currents.

* * * * *